(12) United States Patent
Chang et al.

(10) Patent No.: US 7,265,481 B2
(45) Date of Patent: Sep. 4, 2007

(54) PIEZOELECTRIC ACTUATOR AND FLUID EJECTION HEAD HAVING THE SAME

(75) Inventors: Junhua Chang, Nagano (JP); Takahiro Katakura, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 223 days.

(21) Appl. No.: 10/498,600

(22) PCT Filed: Mar. 17, 2003

(86) PCT No.: PCT/JP03/03153

§ 371 (c)(1),
(2), (4) Date: Jun. 14, 2004

(87) PCT Pub. No.: WO03/078166

PCT Pub. Date: Sep. 25, 2003

(65) Prior Publication Data

US 2005/0225205 A1  Oct. 13, 2005

(30) Foreign Application Priority Data

Mar. 18, 2002 (JP) .............................. 2002-075087
Jul. 8, 2002 (JP) .............................. 2002-199178
Mar. 14, 2003 (JP) .............................. 2003-069235

(51) Int. Cl.
*H01L 41/08* (2006.01)

(52) U.S. Cl. ....................... 310/330; 310/331

(58) Field of Classification Search ............... 310/328, 310/324, 365–366, 311, 332; H01I 41/08; B41J 2/45
See application file for complete search history.

(56) References Cited

U.S. PATENT DOCUMENTS 6,441,537 B1 * 8/2002 Takeuchi et al. ............ 310/328
6,504,287 B2   1/2003 Yun et al.
7,053,526 B2 * 5/2006 Unno et al. ................. 310/324
7,067,961 B2 * 6/2006 Takahashi et al. .......... 310/330

FOREIGN PATENT DOCUMENTS

| EP | 0709195 | * | 10/1995 |
| EP | 709195 A1 | | 5/1996 |
| JP | 2-289352 A | | 11/1990 |
| JP | 3-128681 A | | 5/1991 |
| JP | 8-118630 A | | 5/1996 |
| JP | 9-277531 A | | 10/1997 |
| JP | 9-323410 A | | 12/1997 |
| JP | 10-34924 A | | 2/1998 |
| JP | 11-5305 A | | 1/1999 |
| JP | 11-207975 A | | 8/1999 |
| JP | 2000-77438 A | | 3/2000 |
| JP | 2000-141647 A | | 5/2000 |
| JP | 2000-332313 A | | 11/2000 |
| JP | 2001-77438 A | | 3/2001 |
| WO | WO 02/073710 A1 | | 9/2002 |

* cited by examiner

*Primary Examiner*—Mark Budd
(74) *Attorney, Agent, or Firm*—Sughrue Mion, PLLC (57) ABSTRACT

A first common electrode is formed on a vibration plate and to be fixed at a predetermined potential. A first piezoelectric layer is laminated on the first common electrode and having a first thickness. A drive electrode is laminated on the first piezoelectric layer, to which a drive signal is supplied externally. A second piezoelectric layer is laminated on the drive electrode and having a second thickness thicker than the first thickness. A second common electrode is laminated on the second piezoelectric layer and to be fixed at the predetermined potential.

13 Claims, 5 Drawing Sheets

PIEZOELECTRIC ACTUATOR AND FLUID EJECTION HEAD HAVING THE SAME

TECHNICAL FIELD

The present invention relates to a piezoelectric actuator having a piezoelectric element, the element serving as a drive source, formed on the surface of a diaphragm. The present invention also relates to a liquid ejection head incorporating such a piezoelectric element provided on the surface of the diaphragm opposite a pressure chamber and changes the volume of the pressure chamber by the piezoelectric element.

BACKGROUND ART

A piezoelectric element becomes deformed upon receipt of supplied electric energy and is widely used as, e.g., a liquid ejection head, a micropump, or a drive element for use with a sound-generating member (a speaker or the like). Here, the liquid ejection head ejects droplets from nozzle orifices by inducing pressure fluctuations in liquid stored in a pressure chamber. For instance, the liquid ejection head includes a recording head used in an image recording apparatus such as a printer, a liquid-crystal ejection head used in manufacturing a liquid-crystal display, and a coloring material ejection head used in manufacturing a color filter. The micropump is a ultra-compact pump capable of pumping a trace amount of liquid and used at the time of, e.g., delivery of a trace amount of chemical.

One important component used in such a liquid ejection head or a micropump is a piezoelectric actuator having a piezoelectric element provided on the surface of a diaphragm. The piezoelectric actuator is attached to a pressure chamber formation substrate having a void which serves as a pressure chamber, thereby partitioning a part of the pressure chamber with the diaphragm. At the time of ejection of droplets or delivery of liquid, a drive pulse is supplied to the piezoelectric element in order to deform the piezoelectric element and the diaphragm (e.g., a deformation portion of the pressure chamber), thereby changing the volume of the pressure chamber.

In relation to the liquid ejection head or the micropump, strong demand exists for high-frequency actuation of the piezoelectric element. This is intended for implementing high-frequency ejection of droplets or improving liquid delivery capability. In order to implement high-frequency actuation of the piezoelectric element, compliance of the deformation portion must be made smaller than that of a conventional piezoelectric element, and the amount of deformation of the piezoelectric element must be made greater than that employed conventionally. The reason for these measures is that a reduction in compliance of the deformation portion leads to an improvement in responsiveness. The piezoelectric element can be actuated at a frequency higher than a conventional frequency. Further, an increase in the amount of deformation of the piezoelectric element leads to an increase in the amount of volumetric change in the pressure chamber. Hence, the quantity of droplet to be ejected and the quantity of liquid to be delivered can be increased.

A piezoelectric element of multilayer structure has been proposed as an element which satisfies mutually contradictory characteristics; that is, the compliance of the deformation portion and the amount of deformation of the piezoelectric element. For instance, there has been put forward a piezoelectric element having a structure in which the piezoelectric layer is formed into a two-layer structure; that is, an upper piezoelectric body and a lower piezoelectric body, and in which a drive electrode (individual electrode) is formed at a boundary between the upper piezoelectric body and the lower piezoelectric body. Further, a common electrode is formed on an exterior surface of the upper piezoelectric body and an exterior surface of the lower piezoelectric body (as described on, e.g., Japanese Patent Publication No. 2-289352A, page 6 and FIG. 5; and Japanese Patent Publication No. 10-34924A, page 5 and FIG. 9).

Since the piezoelectric element of multilayer structure has a drive electrode provided at a boundary between the upper piezoelectric body and the lower piezoelectric body, the respective layer piezoelectric bodies are provided with electric fields whose intensities are defined by intervals between the drive electrode and the respective common electrodes (i.e., the thicknesses of the respective layer piezoelectric bodies) and potential differences between the drive electrode and the respective common electrode. Therefore, when compared with a piezoelectric element of a single layer structure having a single layer of piezoelectric body sandwiched between the common electrode and the drive electrode, the piezoelectric element can be deformed greatly with the same drive voltage as a conventional drive voltage even when the thickness of the entire piezoelectric element is increased slightly and the compliance of the deformation portion is reduced.

However, acquisition of a characteristic which can respond to a recent high level of demand cannot be achieved by mere use of the piezoelectric element of multilayer structure. For this reason, there is no alternative but to use, as an actual product, a piezoelectric element of single structure in which a single layer of piezoelectric body is sandwiched between the common electrode and the drive electrode. This failure can conceivably be attributed to various reasons, including insufficient stability of deformation in a piezoelectric element and the amount of deformation of the piezoelectric element, as well as insufficient manufacturing efficiency and insufficient reliability of a product.

DISCLOSURE OF THE INVENTION

It is therefore an object of the invention is to enhance stability of deformation of a piezoelectric element of multilayer structure, as well as to enhance deformation efficiency of the piezoelectric element. Further, another object of the invention is to enhance reliability while improving manufacturing efficiency.

In order to achieve the above object, according to the invention, there is provided a piezoelectric actuator, comprising:

a vibration plate;

a first common electrode, formed on the vibration plate and to be fixed at a predetermined potential;

a first piezoelectric layer, laminated on the first common electrode and having a first thickness;

a drive electrode, laminated on the first piezoelectric layer, to which a drive signal is supplied externally;

a second piezoelectric layer, laminated on the drive electrode and having a second thickness thicker than the first thickness; and a second common electrode, laminated on the second piezoelectric layer and to be fixed at the predetermined potential.

With such a configuration, the linearity of deformation of an upper piezoelectric layer can be made preferable. As a result, deformation of the piezoelectric element, which arises at the time of driving operation, can be controlled more precisely, thereby enhancing stability of deformation.

Preferably, the drive electrode has a first width in a first direction, and the second piezoelectric layer has a second width in the first direction which is wider than the first width, so as to cover both ends in the first direction of the drive electrode.

With such a configuration, the drive electrode remains embedded in the piezoelectric body. Hence, occurrence of atmospheric discharge can be prevented, thereby preventing occurrence of faulty operation. The configuration prevents occurrence of a failure, such as occurrence of a short circuit between a drive electrode and another electrode which would otherwise be caused during manufacturing operation or when the piezoelectric actuator is in use.

According to the invention, there is also provided a piezoelectric actuator, comprising:

a vibration plate;

a first common electrode, formed on the vibration plate and to be fixed at a predetermined potential;

a first piezoelectric layer, laminated on the first common electrode and having a first width in a first direction;

a drive electrode, laminated on the first piezoelectric layer, to which a drive signal is supplied externally;

a second piezoelectric layer, laminated on the drive electrode and having a second width in the first direction which is wider than the first width; and a second common electrode, laminated on the second piezoelectric layer and to be fixed at the predetermined potential.

With such a configuration, manufacturing efficiency can be enhanced, and occurrence of a failure such as a short circuit or atmospheric discharge can also be prevented.

Preferably, the drive electrode has a third width in the first direction which is narrower than the second width such that both ends in the first direction of the drive electrode is covered by the second piezoelectric layer.

According to the invention, a piezoelectric actuator, comprising:

a vibration plate;

a first common electrode, formed on the vibration plate and to be fixed at a predetermined potential;

a first piezoelectric layer, laminated on the first common electrode;

a drive electrode, laminated on the first piezoelectric layer, to which a drive signal is supplied externally;

a second piezoelectric layer, laminated on the drive electrode and having and having a first width in a first direction; and a second common electrode, laminated on the second piezoelectric layer and to be fixed at the predetermined potential, the second common electrode having a second width in the first direction which is substantially identical with the first width.

With such a configuration, the entirety of an upper piezoelectric layer can be deformed, thereby improving deformation efficiency of the piezoelectric element.

According to the invention, there is also provided a liquid ejection head, comprising any one of the above piezoelectric actuators such that the vibration plate constitutes a part of a chamber communicated with a nozzle orifice from which a liquid droplet is ejected.

Preferably, the chamber has a first width in a first direction, and the second piezoelectric layer has a second width in the first direction wider than the first width.

Preferably, the chamber has a first width in a first direction and the first piezoelectric layer has a second width in the first direction wider than the first width.

With such a configuration, the width of the drive electrode can be broadened to the greatest possible extent, and the amount of deformation of the piezoelectric element can be increased correspondingly.

BEST MODE FOR CARRYING OUT THE INVENTION

Figure 5:
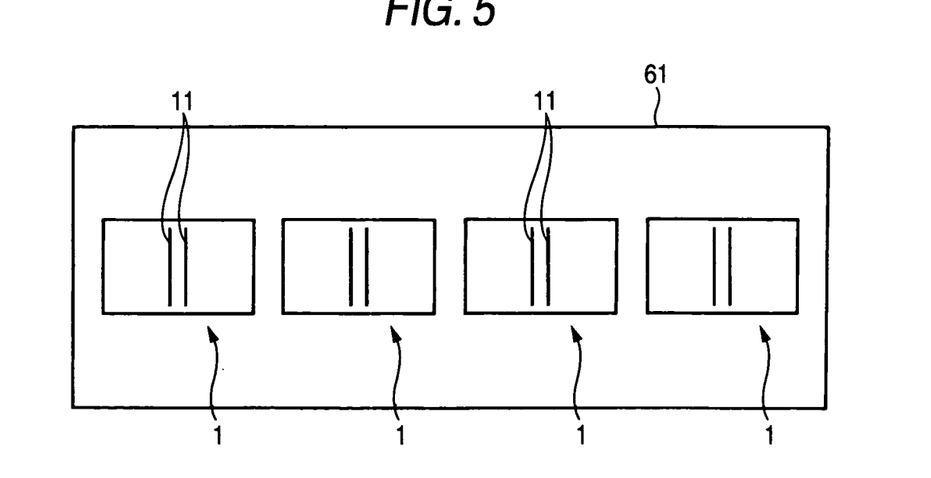
FIG. 5 is a plan view for describing a recording head having a plurality of head main bodies.

Embodiments of the invention will be described hereinbelow by reference to the accompanying drawings. Here, the embodiments will be described by taking, as an example, a recording head (a kind of liquid ejection head) provided in an image recorder such as a printer or a plotter. For instance, as shown in FIG. 5, the recording head has a plurality of head main bodies 1 which are attached to a mount base 61.

The basic structure of the head main body 1 will first be described.

Figure 1:
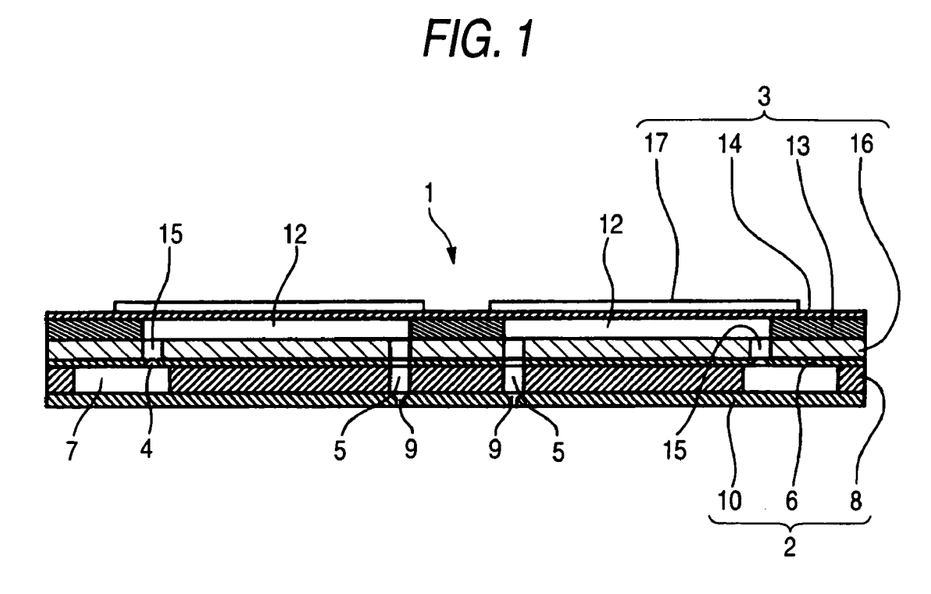
FIG. 1 is a cross-sectional view for describing a basic structure of a head main body.

As shown in FIG. 1, the head main body 1 is formed substantially from a flow passage unit 2 and an actuator unit 3. The flow passage unit 2 is fabricated from a supply port formation substrate 6 having formed therein through holes which are to act as ink supply ports 4, and through holes which are to constitute portions of nozzle communication ports 5, an ink chamber formation substrate 8 having formed therein through holes which are to act as a common ink chamber 7, and through holes which are to constitute the portions of the nozzle communication ports 5, and a nozzle plate 10 having formed therein nozzle orifices 9 oriented in a secondary scanning direction (i.e., a direction orthogonal to a primary scanning direction in which a recording head is to move). The supply port formation substrate 6, the ink chamber formation substrate 8, and the nozzle plate 10 are formed by pressing, for example, a stainless steel plate. The flow passage unit 2 is fabricated by placing the nozzle plate 10 on one surface of the ink chamber formation substrate 8 (e.g., a lower surface in the drawing) and the supply port formation substrate 6 on the other surface of the same (e.g., an upper surface in the drawing), and bonding together the supply port formation substrate 6, the ink chamber formation substrate 8, and the nozzle plate 10. For instance, the flow passage unit 2 is fabricated by bonding together the members 6, 8, and 10 by use of, e.g., a sheet-shaped adhesive.

Figure 2:
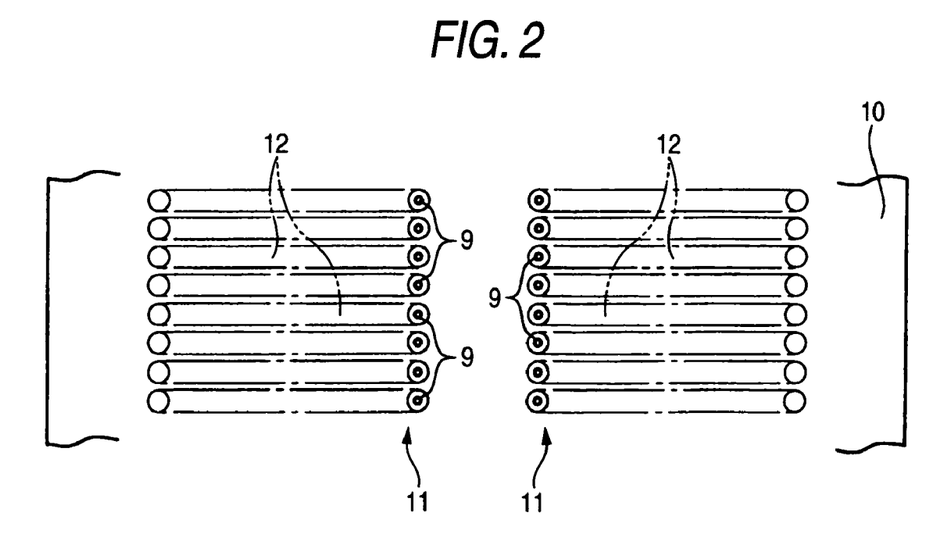
FIG. 2 is a plan view of the head main body when viewed from a nozzle plate.

As shown in FIG. 2, the nozzle orifices 9 are formed in a plurality of rows at predetermined pitches. Rows of nozzles 11 are formed from the plurality of nozzle orifices 9 arranged in rows. For example, a row of nozzles 11 is formed from 92 nozzle orifices 9. Two rows of nozzles 11 are formed side by side.

The actuator unit 3 is a member also called a head chip. The actuator unit 3 comprises a pressure chamber formation substrate 13 having formed therein through holes (or voids) which are to constitute pressure chambers 12, a diaphragm 14 for partitioning portions of the respective pressure chambers 12; a cover member 16 having formed therein through holes which are to constitute portions of supply-side communication ports 15, and through holes which are to constitute portions of the nozzle communication ports 5; and a piezoelectric element 17 serving as a drive source. With regard to the thicknesses of the members 13, 14, and 16, the pressure chamber formation substrate 13 and the cover member 16 preferably assume a thickness of 50 µm or more, more preferably, 100 µm or more. The diaphragm 14 preferably assumes a thickness of 50 µm or less, more preferably, 3 to 12 µm.

In the actuator unit 3, the diaphragm 14 and the piezoelectric element 17 constitute a piezoelectric actuator of the invention. The diaphragm 14 is a kind of support member on which the piezoelectric element 17 is to be provided.

The actuator unit 3 is made by bonding the cover member 16 to one surface of the pressure chamber formation substrate 13 and the diaphragm 14 to the other surface of the same, and by forming the piezoelectric element 17 on the surface of the diaphragm 14. Of these members, the pressure chamber formation substrate 13, the diaphragm 14, and the cover member 16 are made from ceramics, such as alumina or zirconia, by sintering.

The pressure chamber formation substrate 13, the diaphragm 14, and the cover member 16 are bonded together in accordance with the following procedures. First, ceramic slurry is prepared from ceramic material, a binder, a liquid medium, or the like. Next, a green sheet (i.e., a sheet material which has not yet been sintered) is formed from the slurry through use of a common apparatus such as a doctor blade apparatus or a reverse roll coater. Subsequently, the green sheet is subjected to processing, such as cutting or punching, thereby forming required through holes. Thus, sheet-shaped precursors for the pressure chamber formation substrate 13, the diaphragm 14, and the cover member 16 are formed. The sheet-shaped precursors are laminated and sintered, thereby integrating the sheet-shaped precursors into a single sheet-shaped member. In this case, since the respective sheet-shaped precursors are sintered integrally, special bonding operation is not required. Moreover, a high sealing characteristic can also be achieved at joined surfaces of the respective sheet-shaped precursors.

The pressure chambers 12 and the nozzle communication ports 5, which are equal in number to units, are formed in one sheet-shaped member. Specifically, a plurality of actuator units (head chips) 3 are formed from one sheet-shaped member. For instance, a plurality of chip areas, which are to become single actuator units 3, are set in a matrix pattern within one sheet-shaped member. Required members, such as the piezoelectric element 17, are formed in each chip area. The sheet-shaped member (i.e., a ceramic sheet) on which the required members are formed is sliced for each chip area, thereby producing a plurality of actuator units 3.

The pressure chamber 12 is a hollow section which is elongated in the direction orthogonal to the row of nozzles 11, and a plurality of pressure chambers 12 are formed so as to correspond to the nozzle orifices 9. Specifically, as shown in FIG. 2, the pressure chambers 12 are arranged in rows aligned with the row of nozzles. One end of each pressure chamber 12 is in communication with the corresponding nozzle orifice 9 by way of the nozzle communication port 5. The other end of the pressure chamber 12, on the side opposite the nozzle communication port 5, is in communication with the common ink chamber 7 by way of the supply-side communication port 15 and the ink supply port 4. A part of the pressure chamber 12 is partitioned by the diaphragm 14.

Figure 3:
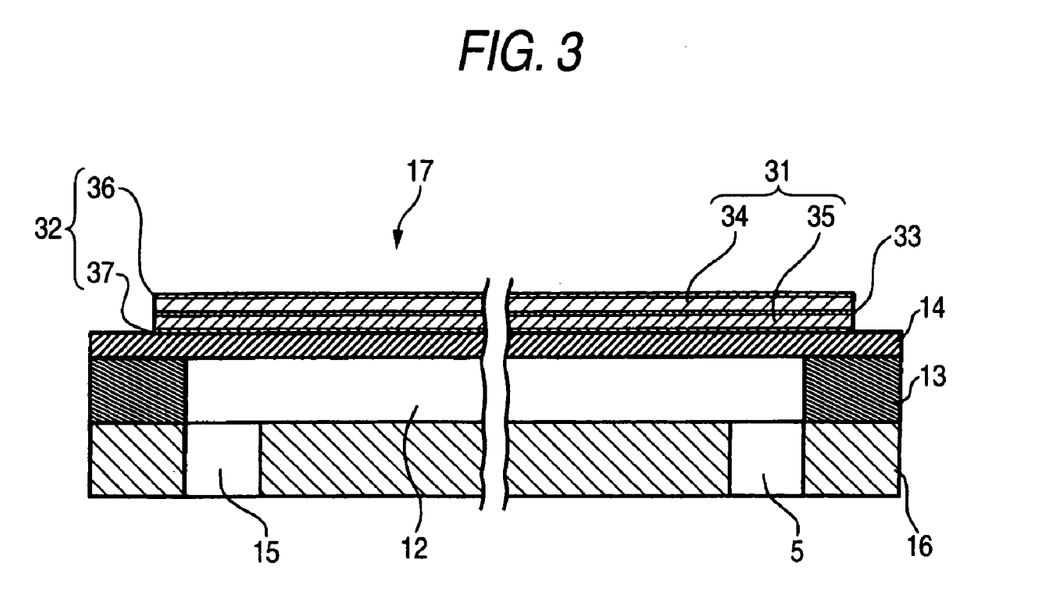
FIG. 3 is a cross-sectional view of an actuator unit according to a first embodiment of the invention when viewed in a longitudinal direction of a pressure chamber.

Here, the piezoelectric element 17 is a piezoelectric element of so-called flexural oscillation mode and is provided, for each pressure chamber 12, on the surface of the diaphragm 14 opposite the pressure chamber 12. The width of the piezoelectric element 17 is determined with reference to that of the pressure chamber 12, and the piezoelectric element 17 is somewhat greater in length than the pressure chamber 12. More specifically, the piezoelectric element 17 is formed so as to cover the pressure chamber 12 in the longitudinal direction thereof. For instance, as shown in FIG. 3, the piezoelectric element 17 has a multilayer structure formed from a piezoelectric body layer 31, a common electrode 32, a drive electrode 33, and the like. The piezoelectric body layer 31 is sandwiched between the drive electrode 33 and the common electrode 32. The detailed structure of the piezoelectric element 17 will be described later in detail.

A drive signal supply source (not shown) is electrically connected to the drive electrode 33. The common electrode 32 is controlled to a given earth potential. When a drive signal is supplied to the drive electrode 33, an electric field whose intensity is related to a potential difference between the drive electrode 33 and the common electrode 32 develops. Since the electric field is imparted to the piezoelectric body layer 31, the piezoelectric body layer 31 becomes deformed in accordance with the intensity of the imparted electric field. More specifically, as the electric potential of the drive electrode 33 increases, the piezoelectric body layer 31 contracts in the direction orthogonal to the electric field, thereby deforming the diaphragm 14 such that the volume of the pressure chamber 12 is reduced. In contrast, as the electric potential of the drive electrode 33 decreases, the piezoelectric body layer 31 expands in the direction orthogonal to the electric field, thereby deforming the diaphragm 14 such that the volume of the pressure chamber 12 is increased.

The actuator unit 3 and the flow passage unit 2 are joined. For instance, a sheet-shaped adhesive is interposed between the supply port formation substrate 6 and the cover member 16. In this state, pressure is applied to the actuator unit 3 toward the flow passage unit 2, whereupon the actuator unit 3 and the flow passage unit 2 are bonded together.

In the head main body 1 having such a construction, a continuous ink flow passage is formed for each nozzle orifice 9 so as to extend from the common ink chamber 7 to the nozzle orifice 9 by way of the ink supply port 4, the supply-side communication port 15, the pressure chamber 12, and the nozzle communication port 5. When the actuator unit is in use, the inside of the ink flow passage is filled with ink (a kind of liquid). A corresponding pressure chamber 12 expands or contracts by deforming the piezoelectric element 17, thereby causing pressure fluctuations in the ink stored in the pressure chamber 12. By controlling the ink pressure, the nozzle orifice 9 can be caused to eject an ink droplet. For instance, if the pressure chamber 12 having a stationary volume is subjected to abrupt contraction after having been inflated, the pressure chamber 12 is filled with ink in association with inflation of the pressure chamber 12. By subsequent abrupt contraction, the ink stored in the pressure chamber 12 is pressurized, whereupon an ink droplet is ejected.

Here, high-speed recording operation involves a necessity for ejecting a larger number of ink droplets within a short period of time. In order to satisfy this requirement, the compliance of the diaphragm 14 and that of the piezoelectric element 17 (i.e., a deformed portion of the pressure chamber 12), both elements partitioning the pressure chamber 12 and the amount of deformation of the piezoelectric element 17 must be taken into consideration. More specifically, as the compliance of the deformed portion becomes greater, responsiveness of the pressure chamber to deformation is deteriorated, thereby posing difficulty in driving the recording head at a high frequency. In contrast, as the compliance of the deformed portion becomes smaller, the deformed portion becomes more difficult to deform, whereupon the amount of contraction of the pressure chamber 12 becomes smaller and the volume of one ink droplet is also decreased.

From this viewpoint, in the case of a recording head employing a piezoelectric element of flexural oscillation mode which has already become commercially practical, there is employed a piezoelectric element of monolayer structure formed by interposing a single layer of piezoelectric body between a common electrode and a drive electrode. The piezoelectric element has a maximum response frequency of about 25 kHz and a maximum ink droplet volume of about 13 pL (picoliters).

In the embodiment, the compliance of the deformed portion is reduced by use of the piezoelectric element 17 of multilayer structure. Further, the structure of the piezoelectric element 17 is improved, thereby enabling efficient ejection of a required quantity of ink droplet while enhancing stability of deformation of the piezoelectric element 17. The following description explains this point.

First, the structure of the piezoelectric element 17 is described in detail. As shown in FIG. 3; the piezoelectric body layer 31 is formed from an upper piezoelectric body (i.e., an outer piezoelectric body) 34 and a lower piezoelectric body (i.e., an inner piezoelectric body) 35, which are stacked one over another. The common electrode 32 is formed from an upper common electrode (i.e., a common outer electrode) 36 and a lower common electrode (i.e., a common inner electrode) 37. The common electrode 32 and a drive electrode (individual electrodes) 33 constitute an electrode layer.

Here, the terms "upper (outer)" and "lower (inner)" denote positional relationships with reference to the diaphragm 14. In other words, the terms denote positional relationships with reference to the surface of the piezoelectric element 17 joined to the diaphragm 14 (which can also be referred to as an operating surface to be used for deforming the piezoelectric element 17, to thereby produce an output). The term "upper (outer)" denotes the surface of the piezoelectric element distant from the diaphragm 14, and the term "lower (inner)" denotes the surface of the same close to the diaphragm 14.

The drive electrode 33 is formed at a boundary between the upper piezoelectric body 34 and the lower piezoelectric body 35. The lower common electrode 37 is formed between the lower piezoelectric body 35 and the diaphragm 14. Further, the upper common electrode 36 is formed on the surface of the upper piezoelectric body 34 opposite the lower piezoelectric body 35. Specifically, the piezoelectric element 17 has a multilayer structure comprising, in the order from the diaphragm 14, the lower common electrode 37, the lower piezoelectric body 35, the drive electrode 33, the upper piezoelectric body 34, and the upper common electrode 36. The thickness of the piezoelectric body layer 31 is equal to a total thickness of the upper piezoelectric body 34 and the lower piezoelectric body 35 that is, about 20 μm. Further, the total thickness of the piezoelectric element 17, including the is common electrode 32, is about 23 μm.

The total thickness of the conventional piezoelectric element 17 of monolayer structure is about 15 μm. Accordingly, as the thickness of the piezoelectric element 17 is increased, the compliance of the diaphragm 14 becomes smaller correspondingly.

The upper common electrode 36 and the lower common electrode 37 are controlled to a given potential regardless of the drive signal. In the embodiment, the upper common electrode 36 and the lower common electrode 37 are electrically connected together and controlled to the earth potential. The drive electrode 33 is electrically connected to the drive signal supply source as mentioned above and, hence, changes a potential in accordance with a supplied drive signal. Accordingly, supply of the drive signal induces an electric field between the drive electrode 33 and the upper common electrode 36, and between the drive electrode 33 and the lower common electrode 37, wherein the electric fields are opposite in direction to each other.

Various conductors; e.g., a single metal substance, a metal alloy, or a mixture consisting of electrically insulating ceramics and metal, are selected as materials which constitute the electrodes 33, 36, and 37. The materials are required not to cause any deterioration at a sintering temperature. In the embodiment, gold is used for the upper common electrode 36, and platinum is used for the lower common electrode 37 and the drive electrode 33.

The upper piezoelectric body 34 and the lower piezoelectric body 35 are formed from piezoelectric material containing, e.g., lead zirconate titanate (PZT) as the main ingredient. The direction of polarization of the upper piezoelectric body 34 is opposite that of the lower piezoelectric body 35. Therefore, when the drive signal is applied to the upper piezoelectric body 34 and the lower piezoelectric body 35, the substances expand and contract in the same direction and can become deformed without any problem. Specifically, the upper piezoelectric body 34 and the lower piezoelectric body 35 deform the diaphragm 14 such that the volume of the pressure chamber 12 is reduced with an increase in the potential of the drive electrode 33 and such that the volume of the pressure chamber 12 is increased with a decrease in the potential of the drive electrode 33.

Figure 4:
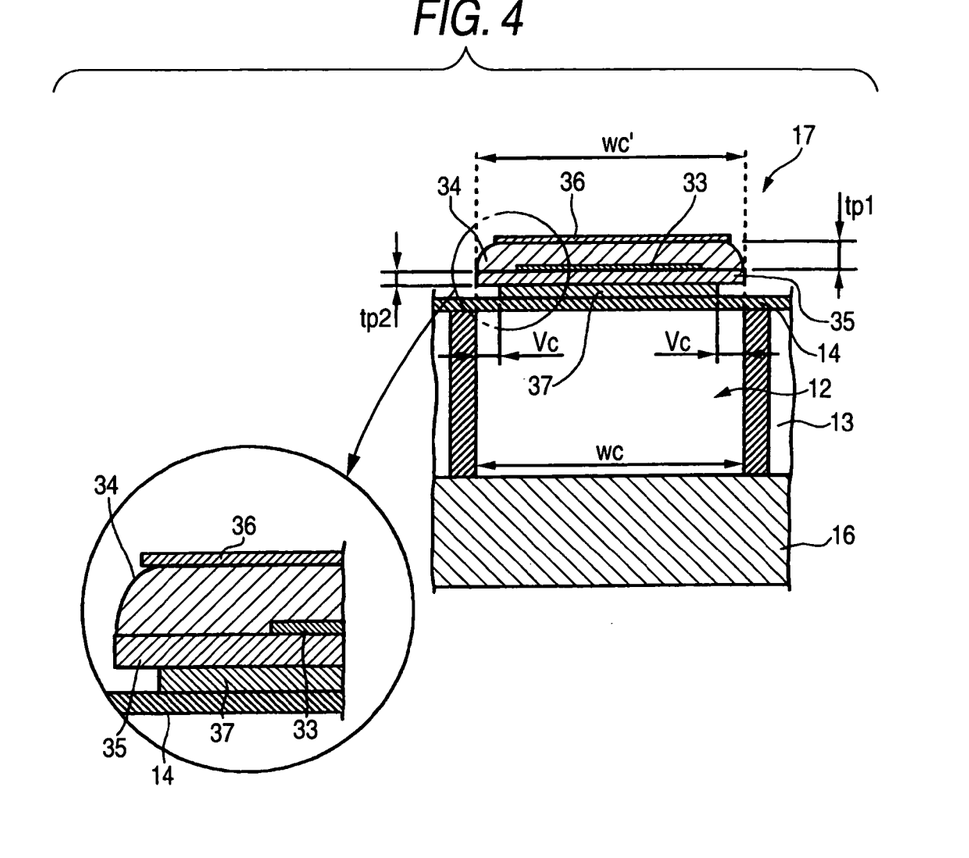
FIG. 4 is a cross-sectional view of the actuator unit according to the first embodiment of the invention when viewed in a transverse direction of a pressure chamber.

As shown in FIG. 4, in the embodiment, in order to efficiently deform the piezoelectric element 17 of multilayer structure, the thickness tp1 of the upper piezoelectric body 34 is made greater than the thickness tp2 of the lower piezoelectric body 35. For instance, the thickness tp1 of the upper piezoelectric body 34 is set to 12 μm, and the thickness tp2 of the lower piezoelectric body 35 is set to 8 μm. By such a configuration, the required drive voltage becomes higher by an amount corresponding to an increase in the thickness of the piezoelectric body layer 31. However, the linearity of deformation of the upper piezoelectric body 34; that is, a characteristic of the upper piezoelectric body capable of tracking a change in the drive signal, can be made favorable. Consequently, deformation of the piezoelectric element 17, which would be induced at the time of driving operation, can be made stable. Namely, the piezoelectric element 17 can be deformed into a designed shape. As a result, the volume of the pressure chamber 12 can be controlled more precisely, and therefore the piezoelectric element is suitable for an application involving more elaborate control of an ejection characteristic; for example, an application to high-quality printing.

With regard to the drive electrode 33, in the embodiment, the upper piezoelectric body 34 is provided so as to be wider than the drive electrode 33. The upper piezoelectric body 34 covers the entire width of the drive electrode 33 in a continuous manner. This is intended for preventing occurrence of a failure, such as atmospheric discharge or the like. Specifically, as mentioned previously, an interval between the drive electrode 33 and the upper common electrode 36 and an interval between the drive electrode 33 and the lower common electrode 37 are very narrow, on the order of a few microns to tens of microns. Application of a voltage of the order of 30 V to 40 V is required to drive the respective layer piezoelectric bodies 34, 35. For this reason, if both end sections of the drive electrode 33 in a transverse direction thereof have appeared below the layer piezoelectric bodies 34, 35, atmospheric discharge may arise in a hot, humid atmosphere, possibly inducing faulty operation or a short circuit during manufacturing operation. When the drive electrode 33 is coated with the upper piezoelectric body 34 as described in the embodiment, the drive electrode 33 is embedded in the piezoelectric body layer 31, thereby preventing occurrence of atmospheric discharge or faulty operation. Further, there can be prevented occurrence of a short circuit between the drive electrode 33 and another electrode (e.g., the upper common electrode 36 or the lower common electrode 37), which would otherwise be caused during manufacturing operation or when the device is in use.

As shown in an enlarged manner in FIG. 4, the piezoelectric body layer 31 (the lower piezoelectric body 35) is provided in an overhung manner in excess of side edges of the lower common electrode 37. Also, the lower common electrode 37 is made narrower than the width wc of the pressure chamber 12 and is provided within the width of the pressure chamber. As a result, elastic regions Vc, Vc where only the diaphragm 14 is situated are formed at both ends of the diaphragm 14 in the transverse direction thereof. Provision of the elastic regions Vc renders the diaphragm 14 easier to deform, thus enhancing deformation efficiency.

In the embodiment, an electrode material, which is thinner and more flexible than electrode materials of other electrodes (e.g., the drive electrode 33 and the lower common electrode 37), is used for the upper common electrode 36. The reason for this is that the upper common electrode 36 is deformed to a greater extent than are other electrodes. Specifically, the upper common electrode 36 is formed on the surface of the upper piezoelectric body 34 and hence becomes deformed to a greater extent than are the other electrodes. For this reason, a material which is softer than those of the other electrodes is used for the upper common electrode 36, and/or the thickness of a material layer is made smaller. As a result, a fracture due to repeated deformation can be prevented. Further, an electrode material having superior conductivity is preferably used so as to prevent occurrence of an excessive increase in electrical resistance, which would otherwise be caused when the thickness of the upper common electrode is reduced.

To be more specific about materials of the electrodes, the upper common electrode 36 is formed from gold, and the drive electrode 33 and the lower common electrode 37 are formed from platinum in the manner mentioned above. In relation to the thickness of an electrode, the lower common electrode 37 and the drive electrode 33 assume a thickness of 2 to 3 μm, whereas the upper common electrode 36 assumes about one-tenth that thickness (e.g., 0.3 μm). By such a configuration, the upper common electrode 36 can be deformed so as to follow the piezoelectric element 17, thereby preventing a reduction in the amount of deformation of the piezoelectric element 17. Further, even when subjected to repeated deformation, the piezoelectric element 17 is not prone to failure, such as rupture. Moreover, an electric current can be caused to flow efficiently through the upper common electrode 36.

Figure 6:
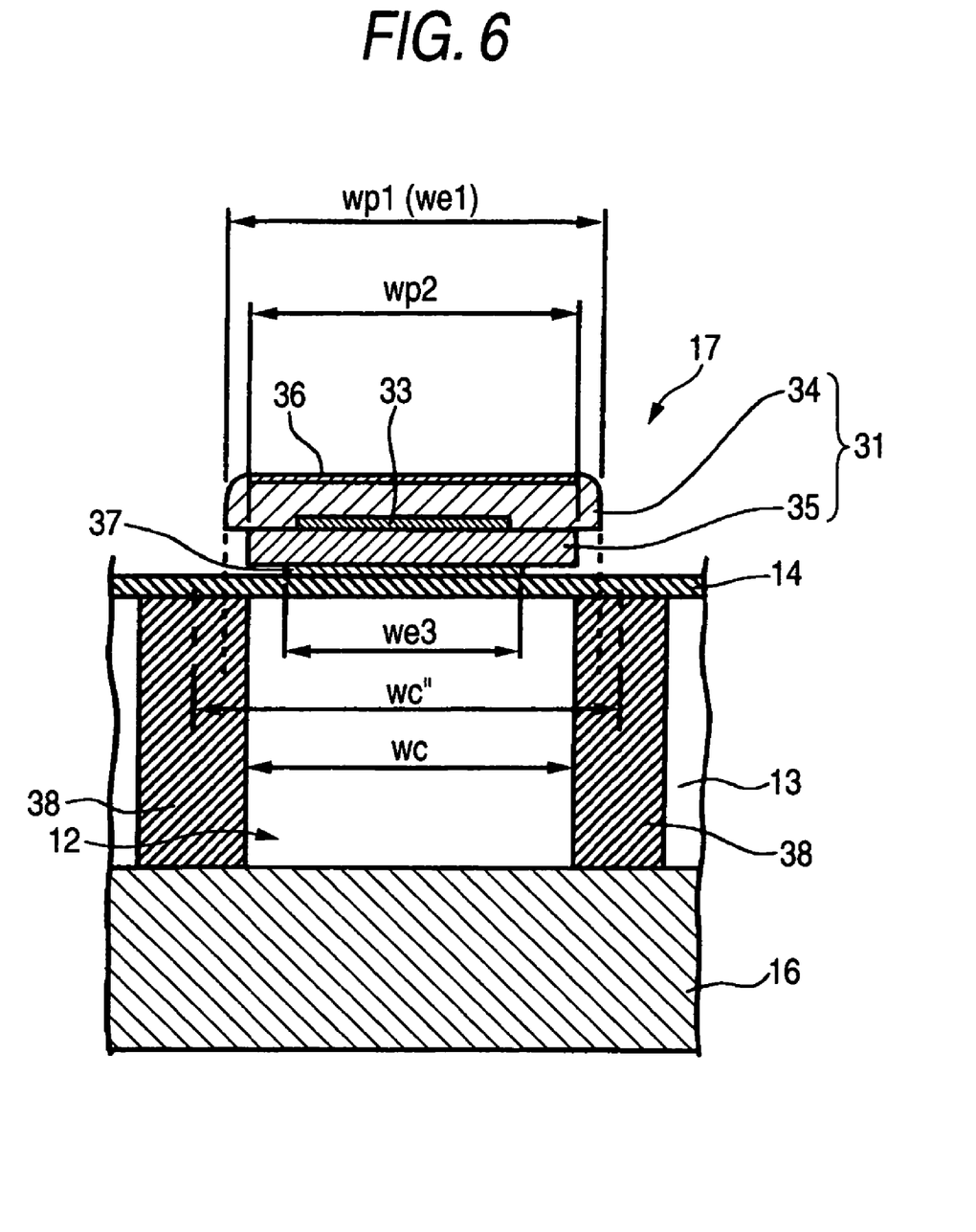
FIG. 6 is a cross-sectional view of an actuator unit according to a second embodiment of the invention when viewed in a transverse direction of a pressure chamber.

A second embodiment shown in FIG. 6 is characterized in that the upper piezoelectric body 34 is formed so as to become wider than the inner dimension wc of the pressure chamber 12; that the upper common electrode 36 is formed so as to become wider than the lower common electrode 37; and that the upper common electrode 36 is formed over the entire width of the upper piezoelectric body 34 in a continuous manner.

In the embodiment, the width wp1 of the upper piezoelectric body 34 is formed so as to become wider than the inner dimension wc of the pressure chamber 12 and the width wp2 of the lower piezoelectric body 35 and narrower than an interval wc" (an interval wc" between partitions) between the centers of pressure chamber partitions 38 in a widthwise direction. Further, the center of the upper piezoelectric body 34 in the transverse direction is aligned with the center of the pressure chamber 12 in the transverse direction. In other words, the upper piezoelectric body 34 is formed inside of a width range defined between the centers of the pressure chamber partitions 38 in the thicknesswise direction thereof (i.e., inside of the range denoted by the partition interval wc"). As a result, a clearance is provided between adjacent upper piezoelectric bodies 34, and the piezoelectric elements 17 are provided without involvement of contact.

The width (formation width) we1 of the upper common electrode 36 is caused to match the width wp1 of the upper piezoelectric body 34. In other words, the upper common electrode 36 is continuously formed from one end to the other end of the upper piezoelectric body 34 in the transverse direction thereof. In the embodiment, gold, which has superior conductivity and is a soft electrode material, is also used for the upper common electrode 36, and is formed into a very thin layer of about 0.3 μm.

In other respects, the recording head is identical in configuration with that described in connection with the previous embodiment. Hence, the same reference numerals are assigned to corresponding portions, and repetitive explanations are omitted.

In the embodiment, the width wp1 of the upper piezoelectric body 34 is wider than the inner width wc of the pressure chamber 12 in the transverse direction thereof, and the upper common electrode 36 is formed so as to cover the upper piezoelectric body 34 in a widthwise direction. An electric field developing between the drive electrode 33 and the upper common electrode 36 affects the entirety of the upper piezoelectric body 34 in a transverse direction. As a result, the entirety of the upper piezoelectric body 34 can be deformed in the transverse direction thereof. Since the upper piezoelectric body 34 is formed so as to become wider than the pressure chamber 12 (i.e., wider than the inner dimension wc), the amount of deformation of the center section of the upper piezoelectric body 34 in the transverse direction thereof can be made greater than in the previous embodiment. Accordingly, the center of the diaphragm 14 in the transverse direction of the pressure chamber 12 can be greatly deformed, thereby efficiently transforming the deformation of the piezoelectric element 17 into a change in the volume of the pressure chamber 12.

The width we1 of the upper common electrode 36 is made greater than the width we3 of the lower common electrode 37. Therefore, the range of deformation of the upper piezoelectric body 34 can be made wider than the range of deformation of the lower piezoelectric body 35. The center section of the upper piezoelectric body 34 in the transverse direction thereof can be deformed to a greater extent than can the center section of the lower piezoelectric body 35. Since the upper piezoelectric body 34 is more distant from the diaphragm 14 than is the lower piezoelectric body 35, deformation of the upper piezoelectric body 34 is amplified, thereby applying the amplified deformation to the diaphragm 14. Even in this regard, the center of the pressure chamber 12 in the transverse direction can be deformed greatly.

By such a configuration, the width of the drive electrode 33 can be broadened to the width of the lower piezoelectric body 35. As mentioned above, as a result of the width of the drive electrode 33 being broadened, an electric field developing between the electrodes can be made more intense than in the previous embodiment. Therefore, the piezoelectric element 17 can be deformed to as great an extent as possible, thus increasing a change in the volume of the pressure chamber 12 to as great a level as possible.

In the embodiment, the inner dimension wc of the pressure chamber 12 is 160 µm, and a pitch at which the pressure chambers 12 are formed (i.e., an interval corresponding to wc" shown in FIG. 6) assumes a value of 210 µm. Hence, the width wp1 of the upper piezoelectric body 34 can be increased to a maximum of about 1.3 times the inner dimension wc of the pressure chamber 12.

Since the width wp1 of the upper piezoelectric body 34 is greater than the width wp2 of the lower piezoelectric body 35, the upper piezoelectric body 34 can be readily formed. Specifically, at the time of manufacture of the piezoelectric element 17, a paste of electrode material (e.g., platinum) which is to constitute a lower common electrode 37 is applied over the diaphragm 14 in a predetermined pattern by way of a mask, and the thus-applied paste is then sintered. After formation of the lower common electrode 37, a paste of piezoelectric material (e.g., lead zirconate titanate) which is to constitute the lower piezoelectric body 35 is applied over the lower common electrode 37 in a predetermined pattern by way of the mask, and the thus-applied paste is then sintered. Application of a paste and sintering of the same are repetitively in the same manner, whereby the drive electrode 33, the upper piezoelectric body 34, and the upper common electrode 36 are formed sequentially.

During the formation process, a pattern corresponding to the respective upper piezoelectric bodies 34 can be formed so as to become wider than the pattern of the lower piezoelectric body 35. Therefore, alignment of the mask used for forming the upper piezoelectric body 34 becomes relatively easy, thereby enabling an attempt to make a manufacturing operation efficient.

Further, the width wp1 of the upper piezoelectric body 34 is greater than the width wp2 of the lower piezoelectric body 35. Hence, the drive electrode 33 can be covered reliably with the upper piezoelectric body 34. As a result, there can be reliably prevented occurrence of a failure, such as a short circuit between the drive electrode 33 and the common electrode 32, thereby preventing occurrence of a failure such as an atmospheric discharge.

Figure 7:
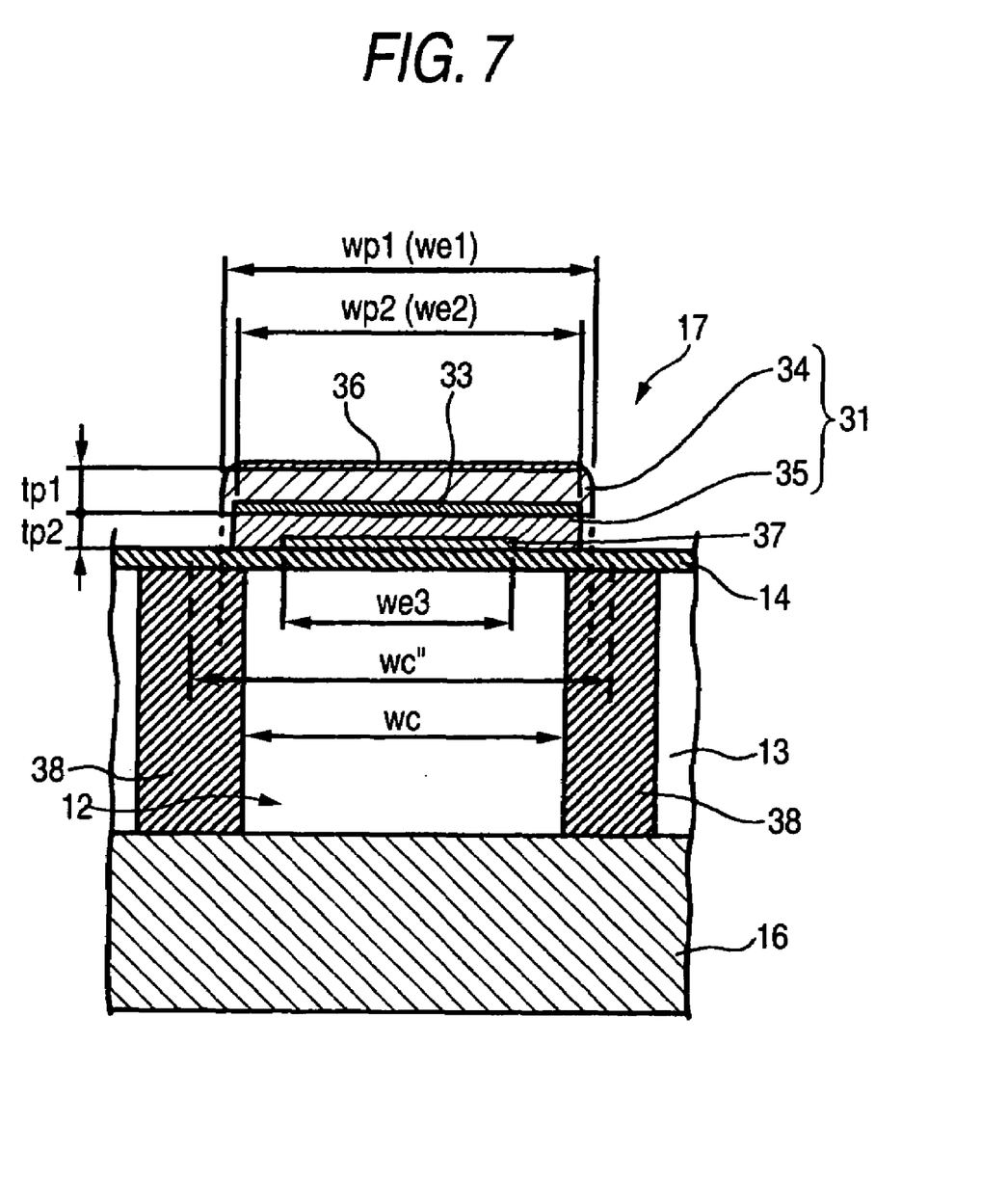
FIG. 7 is a cross-sectional view of an actuator unit according to a third embodiment of the invention when viewed in a transverse direction of a pressure chamber.

A third embodiment shown in FIG. 7 is characterized in that the lower piezoelectric body 34 is formed so as to become wider than the inner dimension wc of the pressure chamber 12.

In the embodiment, the width wp2 of the lower piezoelectric body 35 is formed so as to become wider than the inner dimension wc of the pressure chamber 12. The individual sections are provided in descending order from the widest section as follows. Specifically, the partition interval wc" is the widest, and the width wp1 of the upper piezoelectric body 34 and the width we1 of the upper common electrode 36 are the second widest. The width wp2 of the lower piezoelectric body 35 and the width we2 of the drive electrode 33 are the third widest. The inner dimension wc of the pressure chamber 12 is the fourth widest. The width we3 of the lower common electrode 37 is the smallest.

Even in the embodiment, the centers of the individual sections in the transverse direction thereof are aligned with the center of the pressure chamber 12 in the transverse direction thereof. The thickness tp1 of the upper piezoelectric body 34 is greater than the thickness tp2 of the lower piezoelectric body 35. In other respects, the recording head is identical in configuration with that described in connection with the embodiment. Hence, the same reference numerals are assigned to corresponding portions, and repetitive explanations are omitted.

In the embodiment, the width we2 of the drive electrode 33 is matched with the width of the lower piezoelectric body 35 and set to the largest width. Therefore, electric fields developing between the electrodes can be made more intense, thereby enabling the greatest deformation of the piezoelectric element 17. As a result, ink droplets can be ejected efficiently. Even in this embodiment, the upper common electrode 36 is formed so as to cover the upper piezoelectric body 34 in the transverse direction thereof. Hence, the amount of deformation of the center section of the upper piezoelectric body 34 in the transverse direction can be made greater than in the previous embodiment. Accordingly, even in the embodiment, deformation of the piezoelectric element 17 can be efficiently transformed into a change in the volume of the pressure chamber 12. In addition, the width wp1 of the upper piezoelectric body 34 is grater than the width wp2 of the lower piezoelectric body 35. Hence, the drive electrode 33 can be reliably covered with the upper piezoelectric body 34. As a result, there can be reliably prevented occurrence of a failure, such as a short circuit which would otherwise develop between the drive electrode 33 and the common electrode 32. Further, occurrence of a failure due to an atmospheric discharge can also be prevented.

Moreover, in the embodiment, the width wp2 of the lower piezoelectric body 35 is greater than the inner widthwise dimension wc of the pressure chamber 12. Hence, a deformation portion of the diaphragm 17 is covered with the piezoelectric element 17. Therefore, the compliance of that portion becomes smaller than that of the same portion achieved in the previous embodiment. As a result of a reduction in compliance, the responsiveness of the piezoelectric element to deformation is improved. Hence, the piezoelectric element 17 can be driven at a higher frequency. Consequently; ejection of ink droplets at a higher frequency can be achieved. In the embodiment, the width wp2 of the lower piezoelectric body 35 is set so as to becomes smaller than the width wp1 of the upper piezoelectric body 34.

However, the width wp2 can be increased to the same width as the width wp1 of the upper piezoelectric body 34.

The above explanations have been provided by reference to an example of a recording head, which is a kind of liquid ejection head. However, the invention can also be applied to another liquid ejection head, such as a liquid-crystal ejection head or a coloring material ejection head, as well as to a piezoelectric actuator of the head. The invention can also be applied to a piezoelectric actuator for use with a micropump.

The invention claimed is:

1. A piezoelectric actuator, comprising:
   a vibration plate;
   a first common electrode, formed on the vibration plate and adapted to be fixed at a predetermined potential;
   a first piezoelectric layer, laminated on the first common electrode and having a first thickness;
   a drive electrode, laminated on the first piezoelectric layer, to which a drive signal is supplied externally;
   a second piezoelectric layer, laminated on the drive electrode and having a second thickness thicker than the first thickness; and
   a second common electrode, laminated on the second piezoelectric layer and adapted to be fixed at the predetermined potential.

2. A piezoelectric actuator, comprising:
   a vibration plate;
   a first common electrode, formed on the vibration plate and adapted to be fixed at a predetermined potential;
   a first piezoelectric layer, laminated on the first common electrode and having a first width in a first direction;
   a drive electrode, laminated on the first piezoelectric layer, to which a drive signal is supplied externally;
   a second piezoelectric layer, laminated on the drive electrode and having a second width in the first direction which is wider than the first width; and
   a second common electrode, laminated on the second piezoelectric layer and adapted to be fixed at the predetermined potential.

3. The piezoelectric actuator as set forth in claim 1, wherein the drive electrode has a first width in a first direction, and the second piezoelectric layer has a second width in the first direction which is wider than the first width, so as to cover both ends in the first direction of the drive electrode.

4. The piezoelectric actuator as set forth in claim 2, wherein the drive electrode has a third width in the first direction which is narrower than the second width such that both ends in the first direction of the drive electrode is covered by the second piezoelectric layer.

5. A piezoelectric actuator, comprising:
   a vibration plate;
   a first common electrode, formed on the vibration plate and adapted to be fixed at a predetermined potential;
   a first piezoelectric layer, laminated on the first common electrode;
   a drive electrode, laminated on the first piezoelectric layer, to which a drive signal is supplied externally, the drive electrode having a first width in a first direction;
   a second piezoelectric layer, laminated on the drive electrode and having a second width in the first direction; and
   a second common electrode, laminated on the second piezoelectric layer and adapted to be fixed at the predetermined potential, the second common electrode having a third width in the first direction which is wider than the first width and substantially identical with the second width,
   wherein the first common electrode and the second common electrode are physically isolated.

6. A liquid ejection head, comprising the piezoelectric actuator as set forth in claim 1 such that the vibration plate constitutes a part of a chamber communicated with a nozzle orifice from which a liquid droplet is ejected.

7. The liquid ejection head as set forth in claim 6, wherein the chamber has a first width in a first direction, and the second piezoelectric layer has a second width in the first direction wider than the first width.

8. The liquid ejection head as set forth in claim 6, wherein the chamber has a first width in a first direction and the first piezoelectric layer has a second width in the first direction wider than the first width.

9. A liquid ejection head, comprising the piezoelectric actuator as set forth in claim 2 such that the vibration plate constitutes a part of a chamber communicated with a nozzle orifice from which a liquid droplet is ejected.

10. The liquid ejection head, as set forth in claim 9, wherein the chamber has a third width in the first direction which is narrower than the second width.

11. The liquid ejection head as set forth in claim 9, wherein the chamber has a third width in the first direction which is narrower than the first width.

12. A liquid ejection head, comprising the piezoelectric actuator as set forth in claim 5 such that the vibration plate constitutes a part of a chamber communicated with a nozzle orifice from which a liquid droplet is ejected.

13. A piezoelectric actuator, comprising:
    a first common electrode adapted to be fixed at a predetermined potential;
    a first piezoelectric layer laminated on the first common electrode;
    a drive electrode laminated on the first piezoelectric layer, to which a drive signal is supplied externally, the drive electrode having a first width in a first direction;
    a second piezoelectric layer laminated on the drive electrode and having a second width in the first direction; and
    a second common electrode laminated on the second piezoelectric layer and adapted to be fixed at a predetermined potential, the second common electrode having a third width in the first direction which is wider than the first width and substantially identical with the second width,
    wherein the first common electrode and the second common electrode are physically isolated.

* * * * *